United States Patent
Liu et al.

(10) Patent No.: US 11,116,075 B2
(45) Date of Patent: Sep. 7, 2021

(54) COMPONENT CARRIER COMPRISING DIELECTRIC STRUCTURES WITH DIFFERENT PHYSICAL PROPERTIES

(71) Applicant: AT&S (China) Co. Ltd., Shanghai (CN)

(72) Inventors: Kim Liu, KunShan (CN); Nick Xin, Shanghai (CN); Howard Li, Shanghai (CN); Henry Guo, Suqian (CN)

(73) Assignee: AT&S (China) Co. Ltd., Shanghai (CN)

( * ) Notice: Subject to any disclaimer, the term of this patent is extended or adjusted under 35 U.S.C. 154(b) by 0 days.

(21) Appl. No.: 16/775,794

(22) Filed: Jan. 29, 2020

(65) Prior Publication Data

US 2020/0281071 A1 Sep. 3, 2020

(30) Foreign Application Priority Data

Mar. 1, 2019 (CN) .......................... 201910156775.0

(51) Int. Cl.
| | |
|---|---|
| *H05K 1/18* | (2006.01) |
| *H05K 1/02* | (2006.01) |
| *H01L 23/538* | (2006.01) |
| *H01L 23/31* | (2006.01) |
| *H01L 23/00* | (2006.01) |
| *H05K 1/03* | (2006.01) |
| *H01L 21/56* | (2006.01) |

(Continued)

(52) U.S. Cl.
CPC ....... *H05K 1/0271* (2013.01); *H01L 21/4857* (2013.01); *H01L 21/56* (2013.01); *H01L 23/3121* (2013.01); *H01L 23/5383* (2013.01); *H01L 23/5385* (2013.01); *H01L 23/5389* (2013.01); *H01L 23/562* (2013.01); *H05K 1/036* (2013.01); *H05K 1/185* (2013.01); *H05K 3/0011* (2013.01)

(58) Field of Classification Search
CPC ...... H05K 1/0271; H05K 1/036; H05K 1/185; H05K 3/0011; H05K 2201/09136; H05K 2201/068; H05K 1/182; H05K 1/183; H05K 1/184; H05K 1/186; H01L 23/5389; H01L 23/5385; H01L 23/3121; H01L 23/562; H01L 21/56; H01L 23/5383; H01L 21/4857; H01L 23/145
See application file for complete search history.

(56) References Cited

U.S. PATENT DOCUMENTS

| | | | |
|---|---|---|---|
| 2010/0084175 A1* | 4/2010 | Suzuki ................. | H05K 1/0231 174/260 |
| 2014/0118976 A1* | 5/2014 | Yoshikawa ....... | H01L 23/49827 361/763 |

(Continued)

OTHER PUBLICATIONS

Ajinomoto Film datasheet, Ajinomoto Fine-Techno Co, Inc. (Year: 2021).*

*Primary Examiner* — Steven T Sawyer
(74) *Attorney, Agent, or Firm* — Robert A. Blaha; Smith Tempel Blaha LLC

(57) ABSTRACT

A component carrier with a stack having at least one electrically conductive layer structure and a plurality of electrically insulating layer structures and a component embedded in the stack. The plurality of electrically insulating layer structures include a first dielectric structure and a second dielectric structure differing concerning at least one physical property.

17 Claims, 3 Drawing Sheets

(51) Int. Cl.
*H05K 3/00* (2006.01)
*H01L 21/48* (2006.01)

(56) References Cited

U.S. PATENT DOCUMENTS

2014/0131084 A1* 5/2014 Lee .................. H05K 1/0231
 174/260
2014/0182889 A1* 7/2014 Shin .................. H01L 24/19
 174/251
2016/0338195 A1* 11/2016 Ikeda ................ H05K 1/115
2017/0339784 A1* 11/2017 Zluc ................. H05K 1/189

* cited by examiner

COMPONENT CARRIER COMPRISING DIELECTRIC STRUCTURES WITH DIFFERENT PHYSICAL PROPERTIES

CROSS-REFERENCE TO RELATED APPLICATION

This application claims priority to Chinese Patent Application No. 201910156775.0 filed on Mar. 1, 2019, the disclosure of which is hereby incorporated herein by reference.

TECHNICAL FIELD

Embodiments of the invention relate to a component carrier, a manufacturing method and an arrangement.

TECHNOLOGICAL BACKGROUND

A conventional component carrier comprises a stack having at least one electrically conductive layer structure and a plurality of electrically insulating layer structures and a component such as a semiconductor chip embedded in the stack.

In particular, the present invention relates to a component carrier such as a PCB with one or more embedded component(s) in a high package ratio (for example die-to-package ratio) in a plan view of the component carrier. In the above described conventional carrier, warpage, bow or twist occurs in the component carrier if a high package ratio is used.

SUMMARY

There may be a need to provide a component carrier having a high package ratio in a plan view of the component carrier, wherein the risk of warpage, bow or twist is reduced.

This need is achieved by a component carrier, an arrangement, and a manufacturing method according to the independent claims.

According to an exemplary embodiment of the invention, a component carrier comprises a stack having at least one electrically conductive layer structure and a plurality of electrically insulating layer structures; a component embedded in the stack. The plurality of electrically insulating layer structures comprises a first dielectric structure and a second dielectric structure differing from each other concerning at least one physical proper-ty.

According to another exemplary embodiment of the invention, an arrangement comprising a component carrier having the above-mentioned feature and a further component carrier is provided, wherein the component carrier having the above-mentioned feature (with the component embedded in the stack) is embedded in the further component carrier having different physical properties.

According to an exemplary embodiment, the materials of the dielectric structures of the component carrier with embedded component may be provided with different physical properties which can be used as a design parameter to be adjusted for reducing the risk of warpage, bow or twist.

OVERVIEW OF EMBODIMENTS

The first and second dielectric structures can be electrically insulating. Thus, they may comprise an electrical insulator that can be polarized by an applied electric field. When the first and second dielectric structures are placed in an electric field, electric charges do not pass through the first and second dielectric structures as they do in an electrical conductor, but only slightly shift from their average equilibrium positions causing dielectric polarization.

The at least one physical property can be in particular an elastic modulus (or modulus of elasticity or Young modulus) that is a quantity that measures an object's or substance's resistance to being deformed elastically (i.e., non-permanently or plastically) when a stress is applied to it. The elastic modulus of the first and second dielectric structures can be defined as the slope of its stress-strain curve in the elastic deformation region. The stiffer the material is, the higher the elastic modulus will be. An elastic modulus can be defined as the ratio between the stress and the strain (i.e. stress/strain), where the stress is the force causing the deformation divided by the area to which the force is applied, and the strain is the ratio of the change in some parameter caused by the deformation to the original value of the parameter. For example, this parameter can be the deformation of the first and second dielectric structures, respectively, in the direction in which the stress is applied.

The first and second dielectric structures can be made of a resin sheet, an RCC (resin coated copper), or a prepreg. The resin sheet can be one without glass fibers. The RCC is a material including resin coated copper, for example a resin coated copper foil without glass fibers. The prepreg is a pre-impregnated resin having fibers, for example glass fibers. The respective dielectric structure may also have reinforcing particles such as glass fibers or glass spheres in other embodiments. Different structures can be used with the low modulus material, for example in a PCB with one or more embedded component(s) (including hybrid solutions from different suppliers).

The material can be used for different structures in PCB manufacturing, in particular for PCBs with one or more embedded component(s) (including hybrid solutions from different suppliers).

Due to the first and second dielectric structures, the stack material is more yieldable or flexible, for example against a thermal expansion. Furthermore, mechanical loads are damped as the first and second dielectric structures exhibit a cushioning effect. As a result, overall warpage, bow or twist of the component carrier can be reduced.

In the following, further exemplary embodiments of the present invention will be explained.

In an embodiment, the component is sandwiched between the dielectric structures. Thereby, the component is well protected against mechanical impacts from the outside. Moreover, stress caused by a thermal expansion of the component, which can be a power semiconductor chip, is compensated, dissipated or harmonized by a deformation of the first and second dielectric structures. The thermal expansion of the component is usually much lower than the thermal expansion of the surrounding first and second dielectric structures so that the thermal expansion of the component can sufficiently be compensated for.

In an embodiment, the coefficient of thermal expansion (CTE) depicts the physical property. By adjusting the CTE value of the dielectric structures (which may be very different for component carrier materials of the layer stack, for instance epoxy resin and copper, as compared to a material of the component, for instance silicon), internal stress within the component carrier may be reduced so that also the risk of warpage, bow or twist is reduced. For example, the first dielectric structure, which is arranged above the component, can have a smaller coefficient of thermal expansion than the second dielectric structure which is arranged below the component.

In another embodiment, the Young's modulus depicts the physical property. For example, the first dielectric structure, which is arranged above the component, can have a smaller Young's modulus than the second dielectric structure which is arranged below the component, as the component is usually supported at to the bottom side.

In an embodiment, the Young's modulus of at least one of the dielectric structures, in particular of both dielectric structures, is smaller than 20 GPa. The Young's modulus of less than 20 GPa advantageously achieves a good damping and cushioning effect. The unit GPa means Gigapascal or kN/mm2. When both dielectric structures are made of a low modulus material, the component carrier as a whole may have elastic properties so that the risk of warpage, bow or twist is reduced.

In an embodiment, at least one opening in the stack configured for suppressing warpage of the component carrier. Due to the opening, the stack material is more yieldable or flexible in the opening, for example against a thermal expansion. As a result, overall warpage, bow or twist of the component carrier can be further reduced. The opening can either be a slot, an elongated hole or a sequence of dots.

In an embodiment, the at least one opening is filled by a filling material. The filling material can be different to a material of the stack in terms of a thermal expansion and/or a modulus. The at least one opening can be at least partially filled by the filling material, in particular to cover side walls and/or demarcation lines of the at least one opening. The demarcation lines confine the opening in the stack.

In an embodiment, an area ratio between component and component carrier is larger than 10% in a plan view to the component carrier. Because of the first and second dielectric structures, overall warpage, bow or twist of the component carrier do hardly occur regardless the high package ratio of more than 10%. Component carriers with relatively large embedded components are more prone to warpage, bow or twist than smaller embedded components, so that the above described measures provide particularly pronounced advantages for relatively large embedded components (for instance large semiconductor chips).

In an embodiment, the first and second dielectric structures do not directly contact the component, in particular they surround the component without contact. For example, the component can be embedded in another material such as an encapsulant. The encapsulant can have different properties than the first and/or second dielectric structures.

In an embodiment, at least one of the plurality of the electrically insulating layer structures, which directly contact the component, can be a low modulus material. This electrically insulating layer structure can be implemented by the encapsulant. Thereby, the advantages of the first and second dielectric structures are further enhanced. The Young's modulus of such a low modulus material can be smaller than 20 GPa.

In an embodiment, the component is embedded in an encapsulant which is one of the plurality of electrically insulating layer structures. Due to applying one further dielectric layer, for example the first dielectric structure, on top of a hardened dielectric layer, for example the encapsulant, negative influencing factors (such as moisture, Cu migration, etc.) are at least partially inhibited from spreading throughout the layers. This is due to the fact that a barrier line is created by adding dielectric layers in subsequent process steps.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board. A plate-shaped component carrier also ensures short electric connection paths, and therefore suppresses signal distortion during transport.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, each of the above mentioned electrically insulating layer structures comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (Teflon®), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, each of the above mentioned electrically conductive layer structures comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The embedded component (and/or at least one optional further sur-face mounted component) can in particular be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electro-magnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

In an embodiment of the arrangement, the component carrier with the component embedded in the stack is embedded in a further component carrier with different physical properties. Advantageously, the component, which is encapsulated by a low modulus material in the component carrier, can be very sensitive component which is sufficiently protected against mechanical or thermal loads by the further component carrier.

According to another aspect of the invention, a method of manufacturing a component carrier comprises forming a stack comprising at least one electrically conductive layer structure and a plurality of electrically insulating layer structures, wherein the plurality of electrically insulating layer structures comprises a first dielectric structure and a second dielectric structure differing from each other concerning at least one physical property; and embedding a component in the stack.

In an embodiment, the method comprises forming at least one opening in the stack, wherein the opening is configured to suppress warpage of the component carrier.

In an embodiment, the method comprise filling a filling material in the at least one opening in a further process step.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
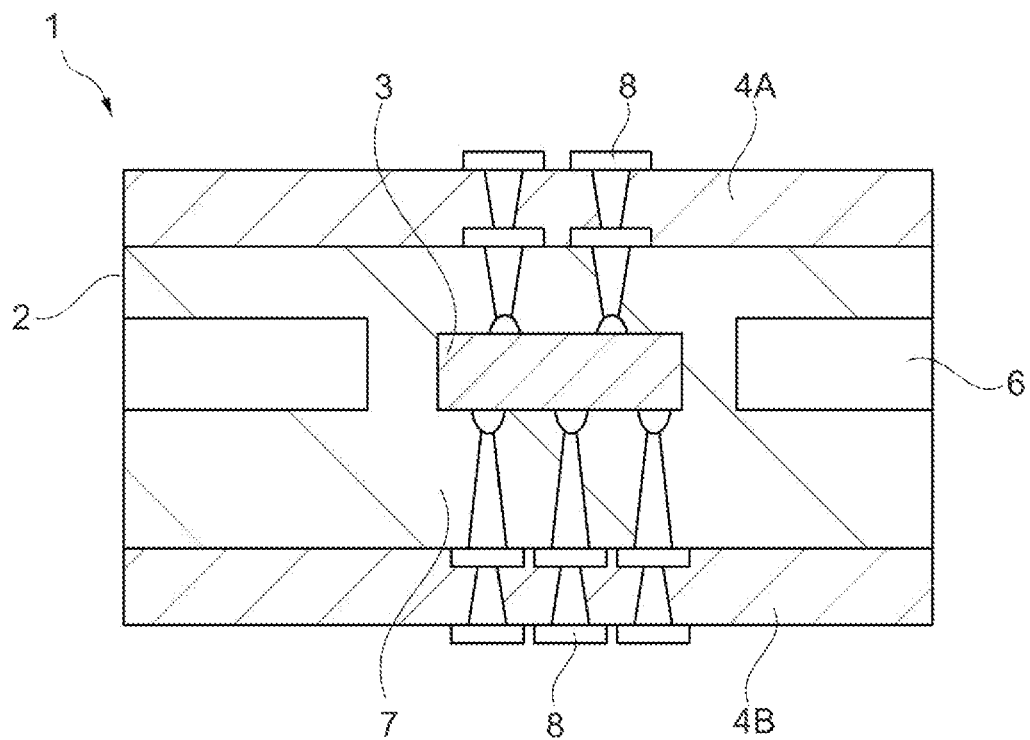
FIG. 1 illustrates a cross-sectional view of a component carrier according to an exemplary embodiment of the invention.

The illustrations in the drawings are schematically presented. In different drawings, similar or identical elements are provided with the same reference signs.

FIG. 1 illustrates a cross-sectional view of a component carrier 1 according to an exemplary embodiment of the invention. The component carrier 1 is shaped as a plate. The component carrier 1 can be configured as one of a group consisting of a printed circuit board and a substrate. The component carrier 1 can be configured as a laminate-type component carrier.

The component carrier 1 comprises a stack 2. The stack 2 is formed by an electrically conductive layer structure 8 and electrically insulating layer structures 4A, 4B, 7. The electrically conductive layer structure 8 can be, at least partly, covered by a part of the electrically insulating layer structures 4A, 4B, 7. The electrically insulating layer structures 4A, 4B, 7 comprise a first dielectric structure 4A and a second dielectric structure 4B differing from each other concerning at least one physical property.

At least one component 3 is embedded in the stack 2.

In the component carrier 1, the embedded component 3 is further surrounded by an encapsulant 7, in particular a mold compound, within the stack 2. The encapsulant 7 also belongs to the plurality of electrically insulating layer structures 4A, 4B, 7. Due to applying one further dielectric layer, for example the first dielectric structure 4A, on top of a hardened dielectric layer, for example the encapsulant 7, negative influencing factors (such as moisture, Cu migration, etc.) are at least partially inhibited from spreading throughout the layers. This is due to the fact that a barrier line is created by adding dielectric layers in subsequent process steps.

The electrically conductive layer structures comprise at least one of the group consisting of copper, aluminum, nickel, silver, gold, palladium, and tungsten, any of the mentioned materials being optionally coated with supraconductive material such as graphene.

The electrically insulating layer structures 4A, 4B, 7 comprise a first dielectric structure 4A arranged above the component 3 and a second dielectric structure 4B arranged below the component 3. The first dielectric structure 4A and the second dielectric structure 4B differ from each other concerning at least one physical property. The physical property can be the coefficient of thermal expansion (CTE) and/or the Young's modulus.

In an alternative embodiment, the electrically insulating layer structures 4A and 4B can be same material with same physical properties, where-in the encapsulant 7 has at least one different physical property compared to the first and second dielectric structures 4A, 4B.

In another alternative embodiment, the encapsulant 7 and first dielectric structure 4A can be same material with same physical properties, wherein the second dielectric structure 4B has at least one different physical property compared to the first dielectric structure 4A and the encapsulant 7.

In another alternative embodiment, the encapsulant 7 and second dielectric structure 4B can be same material with same physical properties, wherein the first dielectric structures 4A has at least one different physical property compared to the second dielectric structure 4B and the encapsulant 7.

Depending on where the thermally conductive connections or the heat spread or the heat sink are located, a heat dissipation area is formed from which the heat is transferred in a direction of heat dissipation or heat spread. Usually, the heat is transferred to the side opposing the electrical contacting side. That side of the component carrier 1, which receives the heat, can have an electrically insulating layer structure having a smaller coefficient of thermal expansion than an electrically insulating layer structure at another side of the component carrier 1. For example, the first dielectric structure 4A, which is arranged above the component 3, can have a smaller coefficient of thermal expansion than the second dielectric structure 4B which is arranged below the component 3.

In another embodiment, the Young's modulus depicts the physical property. For example, the first dielectric structure 4A, which is arranged above the component 3, can have a smaller Young's modulus than the second dielectric structure 4B which is arranged below the component 3, as the component 3 usually needs to be well supported at the side comprising electric contacts.

The Young's modulus of the dielectric structures 4A, 4B is smaller than 20 GPa. Such a Young's modulus of less than 20 GPa advantageously achieves a good damping and cushioning effect.

Besides the first dielectric structure 4A and the second dielectric structure 4B, the electrically insulating layer structures 4A, 4B, 7 may comprise at least one of the group consisting of resin, in particular reinforced or non-reinforced resin, for instance epoxy resin or bismaleimide-triazine resin, cyanate ester, polyphenylene derivate, glass (in particular glass fibers, multi-layer glass, glass-like materials), prepreg material (such as FR-4 or FR-5), polyimide, polyamide, liquid crystal polymer, epoxy-based build-up film, polytetrafluoroethylene (Teflon®), a ceramic, and a metal oxide. The electrically insulating layer structures 4A, 4B, may be formed as cured patterned photo-imageable dielectric layer structures.

The first dielectric structure 4A and a second dielectric structure 4B can be a resin sheet, an RCC (resin coated copper), or a prepreg. The resin sheet can be one without glass fibers. The RCC is a material including resin-coated copper, for example a resin-coated copper foil without glass fibers. The prepreg is a pre-impregnated resin having fibers, for example glass fibers. The low modulus material can be used for different structures in PCB manufacturing, in particular for PCBs with one or more embedded component(s) (including hybrid solutions from different suppliers).

The modulus of the materials can further be selected by taking a thickness difference between the stack 2 and the component 3 into account.

The component 3 in the present embodiment is a semiconductor chip. In addition, a further component 3 can be embedded in the stack 2. The components 3 can be selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier 1 and a logic chip.

The component carrier 1 may further comprise vias (not shown) filled at least partially with an electrically conductive material and formed in the electrically insulating layer structures 4A, 4B, 7. The vias can be electric vias and thermal vias. The vias can have different horizontal and/or vertical dimensions, and the vias can contact the component 3. In particular, the vias can provide for an electrical connection between contacts of the component 3 and the at least one electrically conductive layer structure.

The component carrier 1 optionally further comprises an element 6 such as another component or a core surrounding at least a part of the embedded component 3. The element 6 is embodied here as a solid metal core and can also be a second component similar to the component 3. The element 6 comprises cavities in which the component 3 is embedded. The height of the embedded component 3 can be higher or lower than a height of the element 6.

Thus, the dielectric structures 4A, 4B do not directly contact the component 3, but they surround the component 3 without contact. The component 3 is indirectly sandwiched between the dielectric structures 4A, 4B via the encapsulant 7. The encapsulant 7 can likewise be an electrically insulating layer structure 7, and it can directly contact the component 3. The encapsulant 7 can likewise be a low modulus material.

Alternatively, the component 3 can directly be contacted or sandwiched between the first and second dielectric structures 4A, 4B without the encapsulant 7 therebetween.

Figure 2:
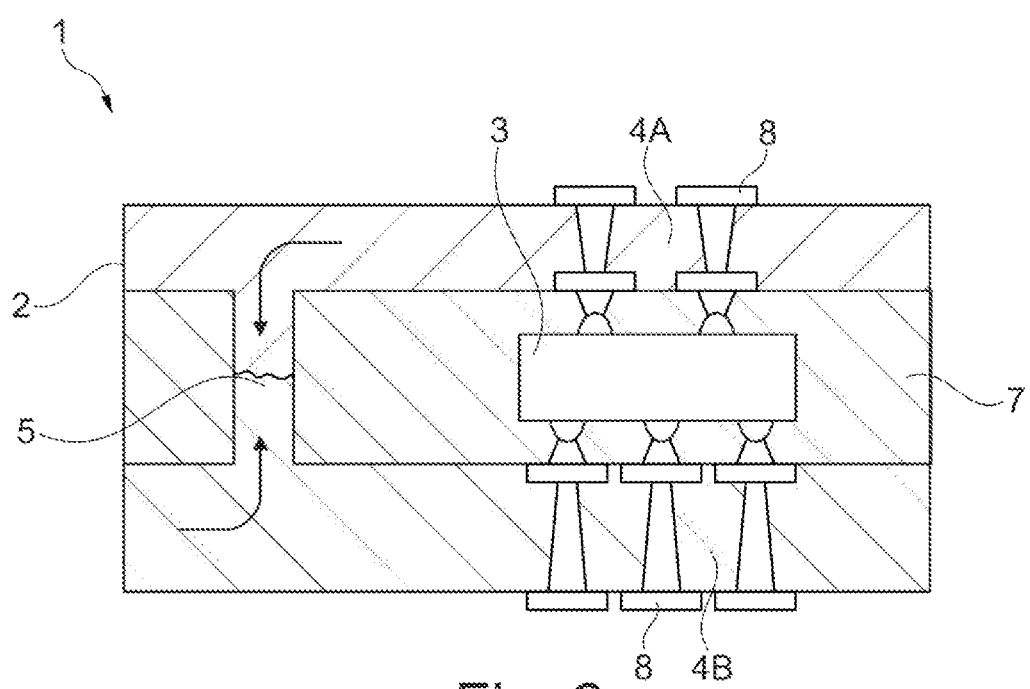
FIG. 2 illustrates a cross-sectional view of a component carrier ac-cording to another exemplary embodiment of the invention.

FIG. 2 illustrates a cross-sectional view of a component carrier according to another exemplary embodiment of the invention. An opening 5 is formed in the stack 2 and configured to suppress warpage of the component carrier 1. Due to the opening 5, the stack material is more yieldable or flexible in the opening 5, for example against thermal expansion. The first and second dielectric structures 4A, 4B, which are low modulus materials, can also exhibit suppressing/softening effects to mechanical stress, which very often but not exclusively results from a thermal expansion. As a result, overall warpage, bow or twist of the component carrier 1 can be reduced.

Furthermore, the opening 5 enables a material flow when the first and second dielectric structures 4A, 4B are manufactured. In other words, the opening 5 can be filled by the material of the first and second dielectric structures 4A, 4B.

Figure 3:
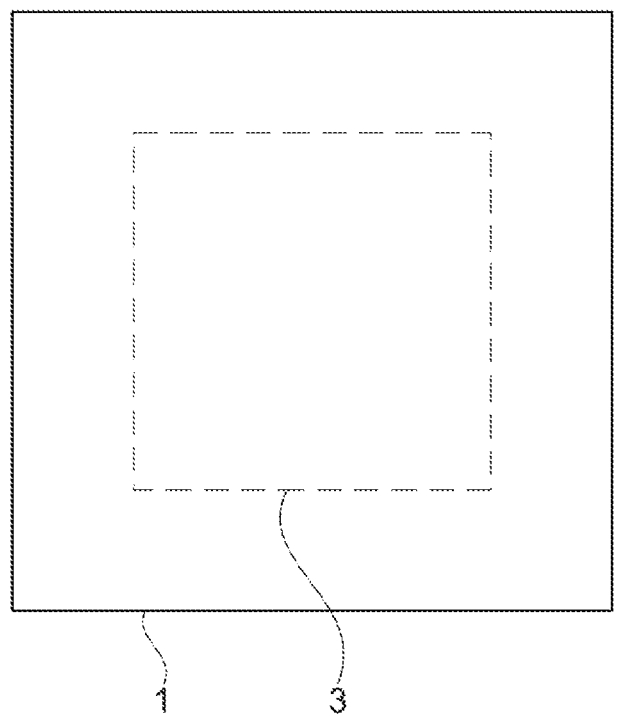
FIG. 3 illustrates a plan view of an embodiment of a component carrier.

In the above-described embodiments as illustrated in FIG. 3, an area ratio between component 3 and component carrier 1 is larger than 10% in a plan view to the component carrier 1. The component carrier 1 such as a PCB with an embedded component has therefore a high package ratio (die-to-package ratio) in a plan view of the component carrier 1. Conventionally, warpage, bow or twist might occur in component carriers if such a high package ratio is used. However, because of the first dielectric structure 4A and the second dielectric structure 4B (FIG. 1), both being made of a low modulus material, warpage, bow or twist of the component carrier 1 is remarkably suppressed.

Figure 4:
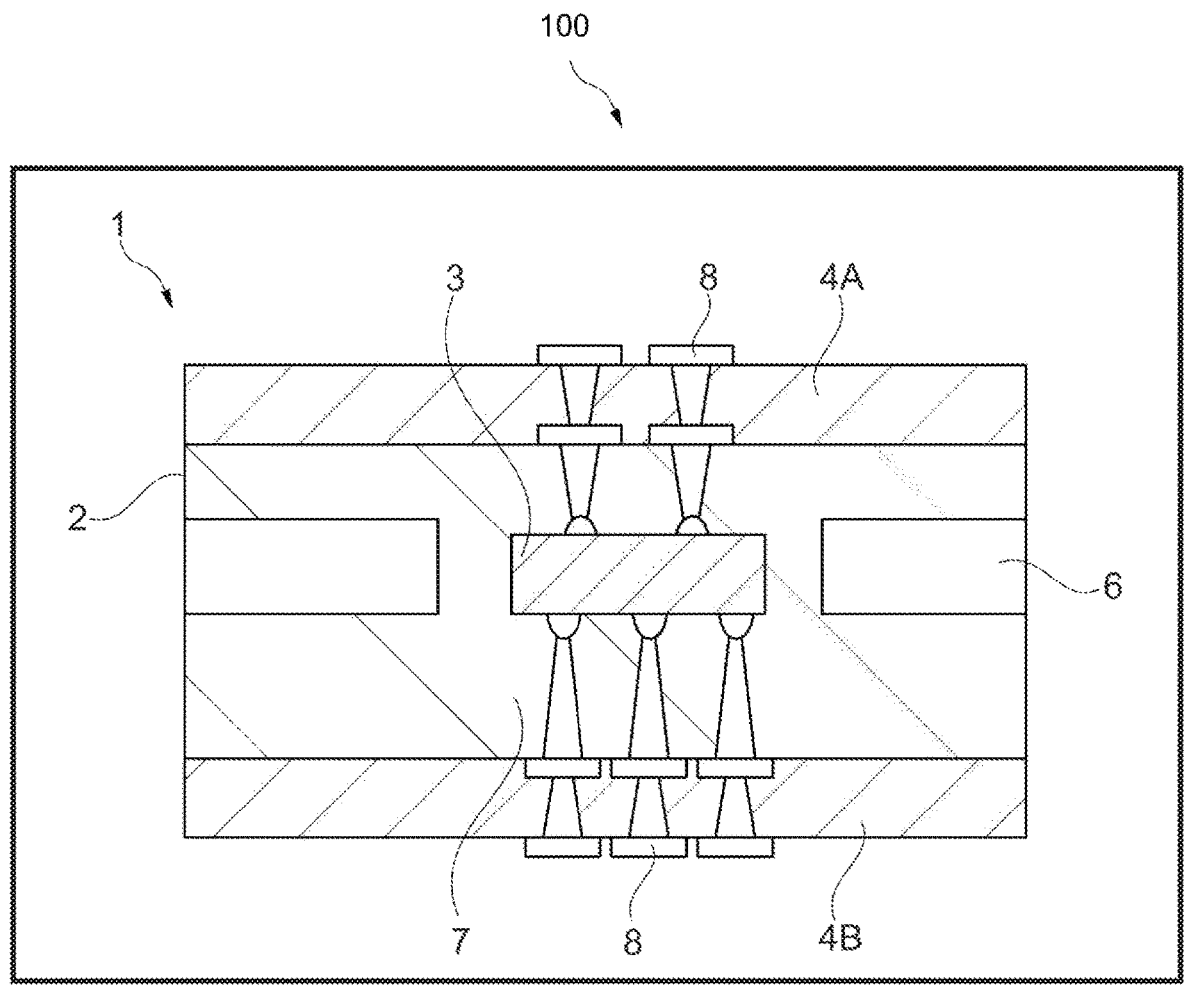
FIG. 4 illustrates a plan view of an embodiment of an assembly.

As illustrated in FIG. 4, a component carrier 1 as arranged for example in the embodiment illustrated in FIG. 1, is arranged in a further component carrier 100 where both are printed circuit boards so that the assembly forms a board-in-board configuration.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
    a stack comprising at least one electrically conductive layer structure and a plurality of electrically insulating layer structures;
    a component embedded in the stack, wherein the component is embedded in an encapsulant which is one of the plurality of electrically insulating layer structures;
    wherein the plurality of electrically insulating layer structures further comprises a first dielectric structure and a second dielectric structure differing from each other concerning at least one physical property,
    wherein the component is sandwiched between the first and second dielectric structures;
    wherein the first and second dielectric structures partially or entirely surround the component without contact;
    wherein the first and second dielectric structures directly contact the encapsulant;
    wherein at least one opening in the stack that is configured to suppress warpage of the component carrier and filled by a filling material;
    wherein the filling material is different to a material of the encapsulant in terms of a coefficient of thermal expansion and/or a Young modulus so that the opening makes the stack more yieldable or flexible during thermal expansion to thereby suppress warpage of the component carrier.

2. The component carrier according to claim 1, wherein the coefficient of thermal expansion depicts the physical property.

3. The component carrier according to claim 1, wherein the Young's modulus depicts the physical property.

4. The component carrier according to claim 1, wherein the Young's modulus of at least one of the first and second dielectric structures is smaller than 20 GPa.

5. The component carrier according to claim 1, comprising at least one of the following features: the at least one opening is at least partially filled by the filling material to cover side walls and/or demarcation lines of the at least one opening; wherein the at least one opening comprises at least one of a group consisting of a slot, an elongated hole, and a sequence of dots; wherein the at least one opening comprises at least one of a group consisting of a through hole, a blind hole or an interior hole.

6. The component carrier according to claim 1, wherein an area ratio between the component and the component carrier is larger than 35% in a plan view to the component carrier.

7. The component carrier according to claim 1, wherein the encapsulant, which directly contacts the component, is a material with a Young modulus smaller than 20 GPa.

8. The component carrier according to claim 1, wherein the component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip.

9. The component carrier according to claim 1, wherein the at least one electrically conductive layer structure comprises at least one of a group consisting of copper, aluminum, nickel, silver, gold, palladium, and tungsten.

10. The component carrier according to claim 1, comprising at least one of the following features:
    wherein the component carrier is shaped as a plate;

wherein the component carrier is configured as one of a group consisting of a printed circuit board, and a substrate;
wherein the component carrier is configured as a laminate-type component carrier.

11. The component carrier according to claim 1,
wherein thicknesses of the first and second dielectric structures are different from each other.

12. An assembly, comprising:
a component carrier including a stack with at least one electrically conductive layer structure and a plurality of electrically insulating layer structures including a first dielectric structure and a second dielectric structure differing from one another in at least one physical property, the component carrier further including a component embedded in an encapsulant where the encapsulant is in direct contact with the first dielectric structure and the second dielectric structure;
wherein at least one opening in the stack is filled by a filling material;
wherein the filling material is different to a material of the encapsulant in terms of a coefficient of thermal expansion and/or a Young modulus; and
a further component carrier, wherein the component carrier with the component is embedded in the further component carrier having different physical properties;
wherein the component carrier and the further component carrier both are printed circuit boards so that the assembly forms a board-in-board configuration.

13. The assembly of claim 12, wherein respective thicknesses of the first and second dielectric structures are different from each other.

14. The assembly of claim 12, comprising at least one of the following features:
the filling material cover side walls and/or demarcation lines of the at least one opening;
wherein the at least one opening comprises at least one of a group consisting of a slot, an elongated hole, and a sequence of dots;
wherein the at least one opening comprises at least one of a group consisting of a through hole, a blind hole or an interior hole.

15. A method of manufacturing a component carrier, comprising:
forming a stack comprising at least one electrically conductive layer structure and a plurality of electrically insulating layer structures, wherein the plurality of electrically insulating layer structures comprises an encapsulant, a first dielectric structure and a second dielectric structure, the first and the second dielectric structures differing from each other concerning at least one physical property; and
embedding a component in the stack such that the component is embedded in the encapsulant;
wherein the first and second dielectric structures partially or entirely surround the component without contact;
wherein the first and second dielectric structures directly contact the encapsulant;
forming at least one opening in the stack;
filling a filling material in the at least one opening in a further process step;
wherein the filling material is different to a material of the encapsulant in terms of a coefficient of thermal expansion and/or a Young modulus so that the opening makes the stack more yieldable or flexible during thermal expansion to thereby suppress warpage of the component carrier.

16. A component carrier, comprising:
a stack comprising at least one electrically conductive layer structure and a plurality of electrically insulating layer structures;
a component embedded in an encapsulant in the stack;
wherein the plurality of electrically insulating layer structures further comprises a first dielectric structure and a second dielectric structure differing from each other concerning at least one physical property; and
at least one opening provided in the stack and filled by a filling material, wherein the filling material is different to a material of the encapsulant in terms of a coefficient of thermal expansion and/or a Young modulus so that the component carrier is yieldable or flexible during thermal expansion to thereby suppress warpage of the component carrier.

17. The component carrier according to claim 16, comprising at least one of the following features:
the at least one opening is at least partially filled by the filling material to cover side walls and/or demarcation lines of the at least one opening;
wherein the at least one opening comprises at least one of a group consisting of a slot, an elongated hole, and a sequence of dots;
wherein the at least one opening comprises at least one of a group consisting of a through hole, a blind hole or an interior hole.

* * * * *